United States Patent
Chrysler et al.

(10) Patent No.: US 8,006,747 B2
(45) Date of Patent: Aug. 30, 2011

(54) MICRO-CHIMNEY AND THERMOSIPHON DIE-LEVEL COOLING

(75) Inventors: Gregory M. Chrysler, Chandler, AZ (US); James G. Maveety, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 164 days.

(21) Appl. No.: 12/319,505

(22) Filed: Jan. 8, 2009

(65) Prior Publication Data

US 2009/0129022 A1   May 21, 2009

Related U.S. Application Data

(62) Division of application No. 11/258,785, filed on Oct. 26, 2005, now Pat. No. 7,487,822, which is a division of application No. 10/042,281, filed on Jan. 11, 2002, now Pat. No. 6,988,531.

(51) Int. Cl.
  F28D 15/00 (2006.01)
  F28F 7/00 (2006.01)
  H05K 7/20 (2006.01)
  H01L 23/10 (2006.01)
  H01L 23/34 (2006.01)

(52) U.S. Cl. .............. 165/104.33; 165/104.21; 165/185; 361/700; 361/702; 257/707; 257/713; 29/890.032

(58) Field of Classification Search .................. 165/48.1, 165/80.2, 80.3, 80.4, 80.5, 104.21, 104.26, 165/104.33, 185; 361/690, 699, 700, 702, 361/718, 719; 257/707, 712, 713, 717; 29/890.032
See application file for complete search history.

(56) References Cited

U.S. PATENT DOCUMENTS

| | | | |
|---|---|---|---|
| 3,678,995 A * | 7/1972 | Collard | 165/185 |
| 3,852,806 A * | 12/1974 | Corman et al. | 165/104.26 |
| 4,204,246 A * | 5/1980 | Arii et al. | 361/699 |
| 4,234,638 A * | 11/1980 | Yamazoe et al. | 428/133 |
| 4,327,399 A * | 4/1982 | Sasaki et al. | 361/698 |
| 4,519,447 A * | 5/1985 | Wiech, Jr. | 165/104.33 |
| 4,782,893 A * | 11/1988 | Thomas | 165/185 |
| 4,858,073 A * | 8/1989 | Gregory | 361/792 |
| 4,970,868 A * | 11/1990 | Grebe et al. | 62/51.1 |
| 4,995,451 A | 2/1991 | Hamburgen | |
| 5,142,441 A * | 8/1992 | Seibold et al. | 361/689 |
| 5,172,301 A * | 12/1992 | Schneider | 165/185 |
| 5,216,580 A * | 6/1993 | Davidson et al. | 361/700 |
| 5,232,047 A | 8/1993 | Matthews | |
| 5,265,321 A * | 11/1993 | Nelson et al. | 361/718 |
| 5,283,715 A * | 2/1994 | Carlsten et al. | 361/702 |
| 5,328,087 A * | 7/1994 | Nelson et al. | 361/779 |
| 5,349,498 A | 9/1994 | Tanzer et al. | |
| 5,355,942 A | 10/1994 | Conte | |
| 5,386,143 A * | 1/1995 | Fitch | 257/715 |
| 5,396,947 A * | 3/1995 | Itoh | 165/104.33 |
| 5,445,308 A * | 8/1995 | Nelson et al. | 361/743 |
| 5,450,283 A * | 9/1995 | Lin et al. | 361/704 |
| 5,542,471 A * | 8/1996 | Dickinson | 165/170 |

(Continued)

*Primary Examiner* — Ljiljana (Lil) V Ciric

(74) *Attorney, Agent, or Firm* — Pillsbury Winthrop Shaw Pittman LLP

(57) ABSTRACT

A semiconductor die is constructed and arranged to have at least one conduit portion therein. At least a portion of the conduit portion is proximate to the localized area. The conduit portion is at least partially filled with a heat-dissipating material. The conduit portion absorbs heat from the localized area and dissipates at least a portion of the heat away from the localized area.

7 Claims, 6 Drawing Sheets

U.S. PATENT DOCUMENTS

| | | | |
|---|---|---|---|
| 5,582,242 A * | 12/1996 | Hamburgen et al. | 165/104.33 |
| 5,629,840 A | 5/1997 | Hamburgen et al. | |
| 5,660,917 A * | 8/1997 | Fujimori et al. | 428/195.1 |
| 5,727,619 A * | 3/1998 | Yao et al. | 165/104.33 |
| 5,780,928 A * | 7/1998 | Rostoker et al. | 257/713 |
| 5,793,611 A * | 8/1998 | Nakazato et al. | 361/704 |
| 5,944,097 A * | 8/1999 | Gungor et al. | 165/185 |
| 6,008,987 A * | 12/1999 | Gale et al. | 361/700 |
| 6,062,302 A * | 5/2000 | Davis et al. | 165/104.26 |
| 6,075,701 A * | 6/2000 | Ali et al. | 361/704 |
| 6,208,513 B1 * | 3/2001 | Fitch et al. | 361/704 |
| 6,219,237 B1 * | 4/2001 | Geusic et al. | 361/699 |
| 6,230,790 B1 * | 5/2001 | Hemingway et al. | 165/104.33 |
| 6,237,223 B1 * | 5/2001 | McCullough | 29/890.032 |
| 6,292,366 B1 * | 9/2001 | Platt | 361/700 |
| 6,374,905 B1 * | 4/2002 | Tantoush | 165/185 |
| 6,377,457 B1 * | 4/2002 | Seshan et al. | 361/690 |
| 6,437,981 B1 * | 8/2002 | Newton et al. | 361/700 |
| 6,448,509 B1 | 9/2002 | Huemoeller | |
| 6,490,159 B1 * | 12/2002 | Goenka et al. | 361/700 |
| 6,503,626 B1 | 1/2003 | Norley et al. | |
| 6,621,701 B2 | 9/2003 | Tamba et al. | |
| 6,623,279 B2 * | 9/2003 | Derian et al. | 361/799 |
| 6,661,659 B2 | 12/2003 | Tamba et al. | |
| 6,665,187 B1 * | 12/2003 | Alcoe et al. | 361/719 |
| 6,666,260 B2 * | 12/2003 | Tantoush | 165/185 |
| 6,686,532 B1 * | 2/2004 | Macris | 257/930 |
| 6,727,422 B2 * | 4/2004 | Macris | 257/717 |
| 6,743,972 B2 * | 6/2004 | Macris | 257/713 |
| 6,788,537 B2 * | 9/2004 | Saita et al. | 361/700 |
| 6,825,557 B2 * | 11/2004 | DiBattista et al. | 257/712 |
| 6,841,491 B1 * | 1/2005 | Sadoughi et al. | 438/778 |
| 6,939,505 B2 | 9/2005 | Musso et al. | |
| 7,001,782 B1 * | 2/2006 | Diana et al. | 257/295 |
| 7,064,963 B2 * | 6/2006 | Oman et al. | 361/792 |
| 7,117,930 B2 * | 10/2006 | Todd et al. | 165/104.21 |
| 7,120,022 B2 * | 10/2006 | Belady et al. | 361/699 |
| 7,224,057 B2 * | 5/2007 | Yang | 257/707 |
| 7,295,441 B1 * | 11/2007 | Laio et al. | 165/80.5 |
| 7,303,005 B2 * | 12/2007 | Reis et al. | 165/185 |
| 7,324,341 B2 * | 1/2008 | Oman | 361/700 |
| 7,390,698 B2 * | 6/2008 | Thornton et al. | 438/106 |
| 7,459,346 B2 * | 12/2008 | Yee et al. | 438/122 |
| 7,560,371 B2 * | 7/2009 | Dando et al. | 438/113 |
| 7,846,778 B2 * | 12/2010 | Rumer et al. | 257/707 |
| 2002/0063330 A1 * | 5/2002 | Macris | 257/712 |
| 2003/0051868 A1 * | 3/2003 | Dishongh et al. | 165/185 |
| 2003/0207495 A1 * | 11/2003 | Akram | 438/108 |
| 2004/0081803 A1 * | 4/2004 | Rauch | 428/172 |

* cited by examiner

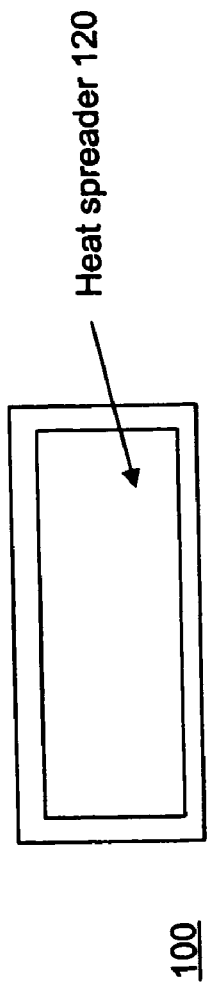
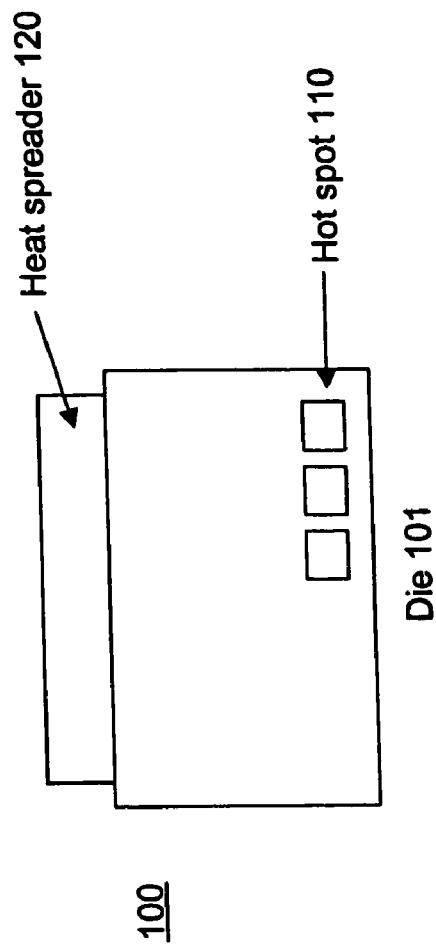
FIG. 1A (Prior Art)
FIG. 1B (Prior Art)

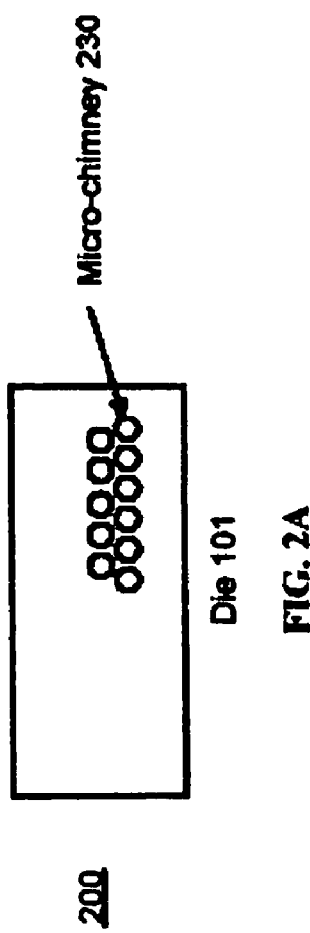
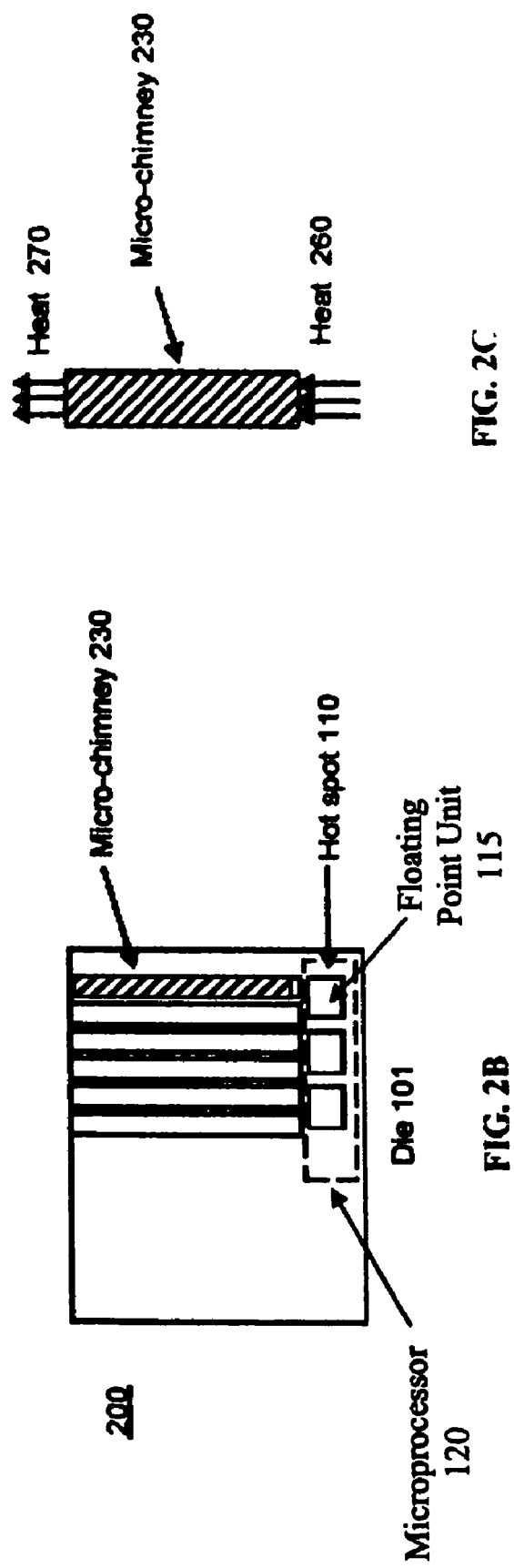

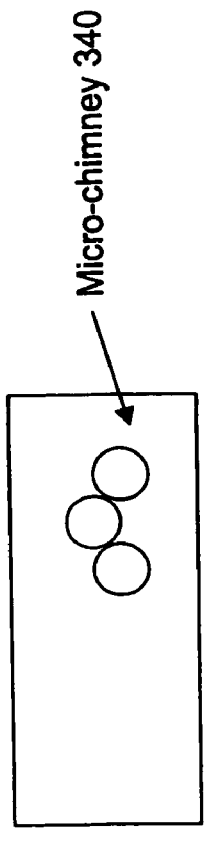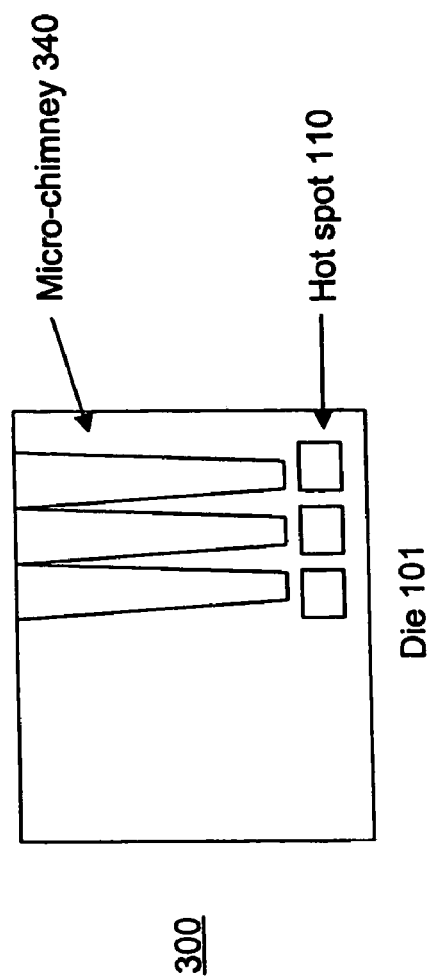

MICRO-CHIMNEY AND THERMOSIPHON DIE-LEVEL COOLING

RELATED APPLICATIONS

This application is a divisional application of application Ser. No. 11/258,785, now U.S. Pat. No. 7,487,822, which is a divisional application of application Ser. No. 10/042,281, now U.S. Pat. No. 6,988,531, the disclosures of which are incorporated herein by reference.

BACKGROUND

1. Field

This invention relates generally to packaging for integrated circuits. More specifically, this invention relates to a method and arrangement for dissipating heat in an integrated circuit.

2. Background and Related Art

Integrated circuits generate heat to varying degrees. In typical applications, such heat must be dissipated to ensure that thermal effects do not impair the performance of, or even damage, integrated circuits. Thermal resistance is defined as temperature difference per unit power dissipated. When thermal resistance values are high, heat is not readily dissipated. In localized areas of a chip, such as a processor chip, heat fluxes may be very large, and temperatures may be very high. For instance, localized heat fluxes over the floating point area of a processor may be on the order of 350 W/cm$^2$, and temperatures may rise as high as 130° C.

Various techniques have been employed to dissipate heat, including the attachment of thermal spreaders, integrated heat spreaders, heatsinks, or fans to integrated circuits. Such techniques involve external control of heat generated internally by integrated circuit components.

FIGS. 1A and 1B (Prior Art) are top and side views, respectively, of a structural arrangement 100. Arrangement 100 includes a semiconductor die 101 and a heat spreader 120 attached to a top face of die 101. Die 101, which may comprise a processor, includes local hot spots 110. Hot spots 110 may be associated with various mechanisms internal to die 101, such as a floating point unit, which generate localized heat. In arrangement 100, localized heat is dissipated away from die 101 only after the heat diffuses to the surface thereof and then diffuses to heat spreader 120.

As processor performance continues to increase, so too does heat generated by processor components. Existing cooling methods may not dissipate sufficient heat to obviate the heat-related problems identified above.

Therefore, what is needed is a method and arrangement for dissipating heat in an integrated circuit.

BRIEF DESCRIPTION OF THE DRAWINGS

FIGS. 1A and 1B (Prior Art) are top and side views, respectively, of a structural arrangement that includes a semiconductor die and a heat spreader.

FIGS. 2A and 2B are top and side views, respectively, of a micro-chimney embodiment of the present invention.

FIG. 2C illustrates heat flow in a micro-chimney according to an embodiment of the present invention.

FIGS. 3A and 3B are top and side views, respectively, of a micro-chimney embodiment of the present invention.

DETAILED DESCRIPTION

Figure 4A:
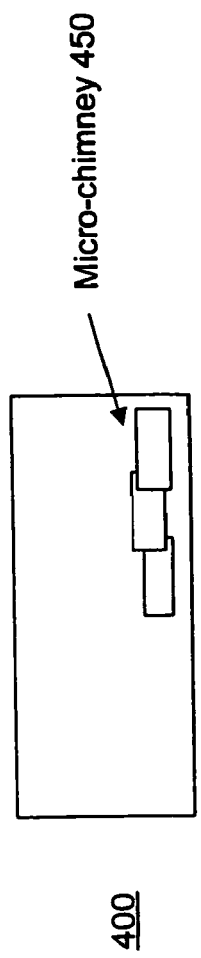
FIGS. 4A and 4B are top and side views, respectively, of a micro-chimney embodiment of the present invention.

A method and arrangement for dissipating heat from a localized area within a semiconductor die, as disclosed herein, involve a semiconductor die that is constructed and arranged to have at least one conduit portion therein. At least a portion of the conduit portion is proximate to the localized area. The conduit portion is at least partially filled with a heat-dissipating material. The conduit portion absorbs heat from the localized area and dissipates at least a portion of the heat away from the localized area. As such, thermal stress on the die is reduced, and total heat from the die is more readily dissipated.

A. Micro-Chimney Embodiments

FIGS. 2A and 2B are top and side views, respectively, of a micro-chimney embodiment 200 including a semiconductor die 101 according to an embodiment of the present invention. Die 101, which is fabricated of silicon, includes one or more hot spots 110 associated with one or more mechanisms internal to die 101, such as a floating point unit 115. Hot spots 110 may correspond to areas in die 101 where heat generation is especially high. Die 101 also includes micro-chimneys 230.

Micro-chimneys 230 may comprise conduits, such as holes, channels, vias, slots, or tubes, located near hot spots 110. Micro-chimneys 230 may trace a path from hot spots 110 to various cooler spots in die 101, such as, for example, areas near a surface of die 101. In exemplary implementations, micro-chimneys 230 may be laser-drilled or etched onto a back face of die 101. In embodiment 200 shown in FIGS. 2A and 2B, micro-chimneys 230 are cylindrical. Micro-chimneys 230 may extend vertically through die 101.

Micro-chimneys 230 may be filled with a material of high conductivity known in the art, such as copper or silver. As such, micro-chimneys 230 provide a highly conductive, low thermal resistive path to dissipate heat away from hot spots 110 to cooler spots in die 101. The heat ultimately may be absorbed and dissipated by an external device (not shown), such as a thermal spreader or integrated heat spreader located near cooler spots in die 101. According to embodiments of the present invention, because heat is more efficiently dissipated, temperature gradients within a semiconductor die are reduced, and a more uniform heat flux leaves the die. Thermal stress on the die is reduced, and total heat from the die is more readily dissipated. As such, processors 120 may perform more reliably.

Micro-chimneys 230 may exist in parallel with existing silicon material in die 101 and need not intersect one another. Such a parallel construction provides a lower overall thermal resistance, resulting in lower thermal resistive paths for heat transfer. In other embodiments, various micro-chimneys may intersect, or be joined with, various other micro-chimneys.

FIG. 2C illustrates heat flow in micro-chimneys 230 of die 101. Heat 260 from a hot spot 110 is absorbed by micro-chimney 230. The highly conductive material in micro-chimney 230 dissipates the heat, transferring heat 270 to a cooler spot in die 101 and, in some embodiments, ultimately to a spreader.

FIGS. 3A and 3B are top and side views, respectively, of a micro-chimney embodiment 300. Semiconductor die 101 includes micro-chimneys 340 that have a tapered, conical geometry. Such a geometry may provide enhanced spreading of heat in certain implementations.

Figure 4C:
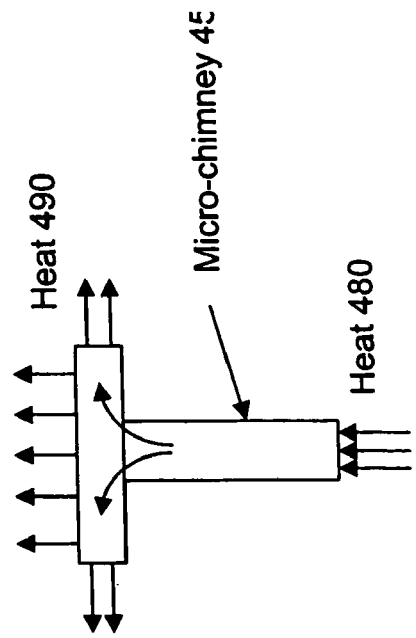
FIG. 4C illustrates heat flow in a micro-chimney according to an embodiment of the present invention.
Figure 4B:
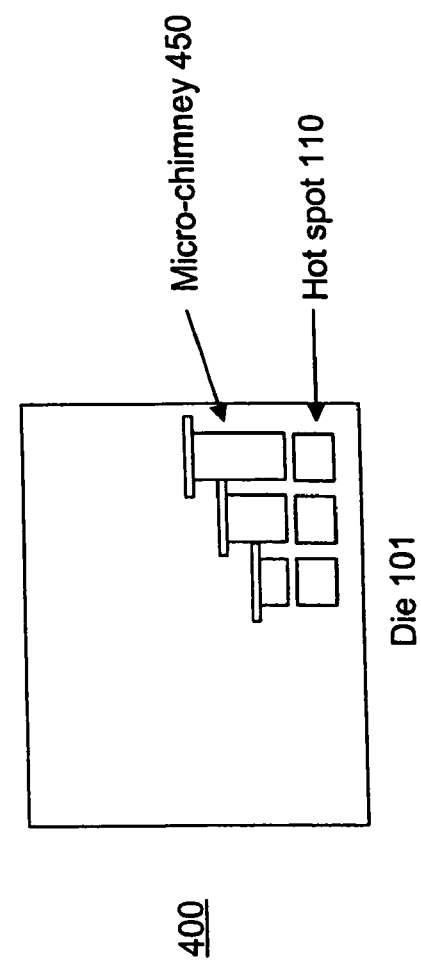

FIGS. 4A and 4B are top and side views, respectively, of a micro-chimney embodiment 400. Semiconductor die 101 includes micro-chimneys 450 that have a T-shaped geometry. Micro-chimneys 450 may be staggered, such as shown in embodiment 400.

FIG. 4C illustrates heat flow in micro-chimneys 450 of die 101. Heat 480 from a hot spot 110 is absorbed by micro-chimney 450. The highly conductive material in micro-chimney 450 dissipates the heat, transferring heat 490 to a cooler spot in die 101 and, in some embodiments, ultimately to a spreader. As shown, the T-shaped geometry provides for enhanced lateral spreading of heat.

B. Thermosiphon Embodiments

Figure 5A:
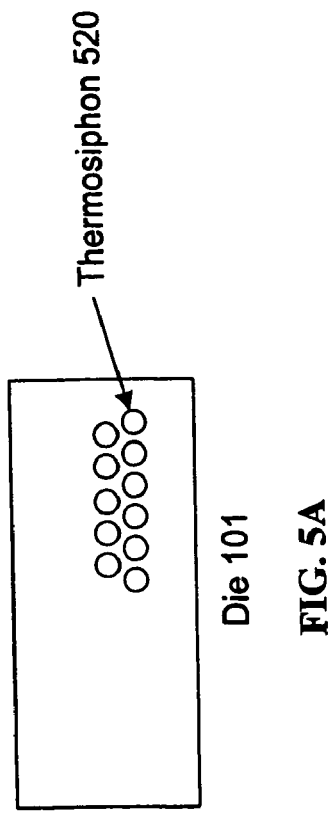
FIGS. 5A and 5B are top and side views, respectively, of a thermosiphon embodiment of the present invention.
Figure 5B:
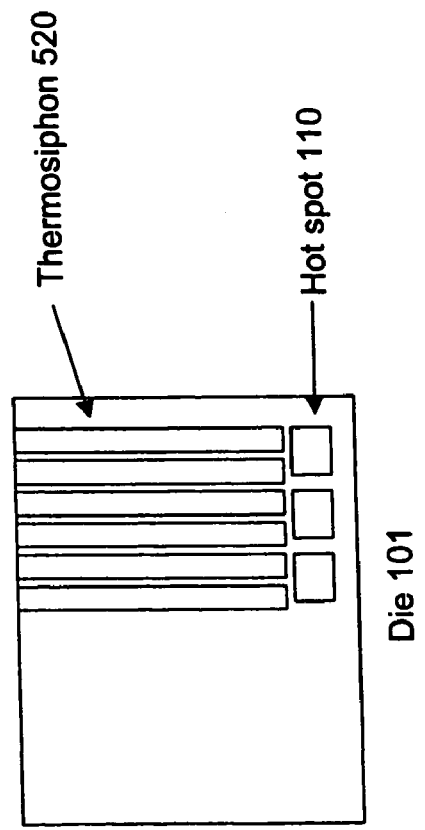

FIGS. 5A and 5B are top and side views, respectively, of a thermosiphon embodiment 500 including a semiconductor die 101 according to an embodiment of the present invention. Die 101 includes thermosiphons 520.

Thermosiphons 520 may comprise conduits, such as holes, channels, vias, slots, or tubes located near hot spots 110. Thermosiphons 520 may trace a path from hot spots 110 to various cooler spots in die 101, such as areas near a surface of die 101. In some embodiments, thermosiphons 520 may be laser-drilled or etched onto a back face of die 101. In embodiment 500, thermosiphons 520 are cylindrical.

Thermosiphons 520 may be partially filled with liquid, such as, for example, water, dielectrics such as fluorocarbons, alcohols, or other fluids capable of changing phase. An embodiment employing water may exploit the latent heat of vaporization of water in order to dissipate heat. In particular, water at a lower end of a thermosiphon 520 near hot spots 110 may evaporate due to high localized heat flux. Because the water vapor has a lower density and increased kinetic energy, the water vapor may travel to the upper end of thermosiphon 520. Heat is transferred to a cooler spot, and the water vapor condenses on the upper end and sides of thermosiphon 520. The water may then drip back to the lower end of thermosiphon 520 by the force of gravity. In other embodiments, because of the small characteristic length scales, surface tension forces may ensure that all surfaces remain wet regardless of their orientation.

Figure 5C:
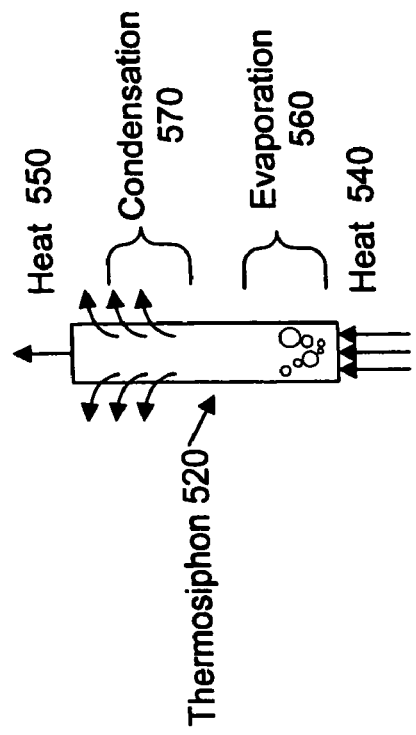
FIG. 5C illustrates heat flow in a thermosiphon according to an embodiment of the present invention.

FIG. 5C illustrates heat flow in thermosiphons 520 of die 101. Heat 540 from a hot spot 110 is absorbed by thermosiphon 520. Water in thermosiphon 520 evaporates in evaporation portion 560 of thermosiphon 520. Heat 550 is transferred through the upper end and sides of thermosiphon 520 to a cooler spot in die 101 and, in some embodiments, ultimately to a spreader. Water vapor condenses in condensation portion 570 of thermosiphon 520. Water flows back down the sides of thermosiphon 520.

As such, thermosiphons 520 provide low thermal resistive paths to dissipate heat away from hot spots 110 to cooler spots in die 101. The heat may ultimately be absorbed and dissipated by an external device (not shown), such as a thermal spreader or integrated heat spreader located near cooler spots in die 101. Because heat is more efficiently dissipated, temperature gradients within a semiconductor die are reduced, and a more uniform heat flux leaves a die. Thermal stress on the die is reduced, and total heat from the die is more readily dissipated.

In another embodiment (not shown), a thermosiphon may comprise a loop-shaped tube. Water and water vapor in the thermosiphon may flow in a generally clockwise or counter-clockwise direction in the tube.

Figure 6A:
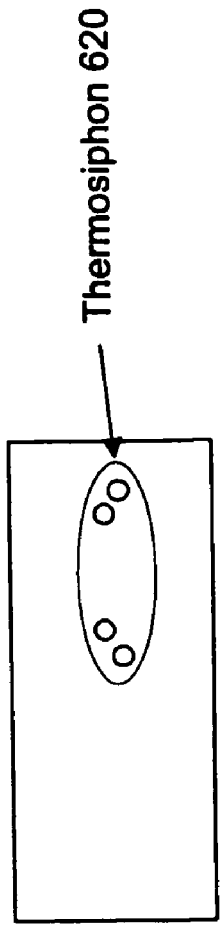
FIGS. 6A and 6B are top and side views, respectively, of a thermosiphon embodiment of the present invention.
Figure 6B:
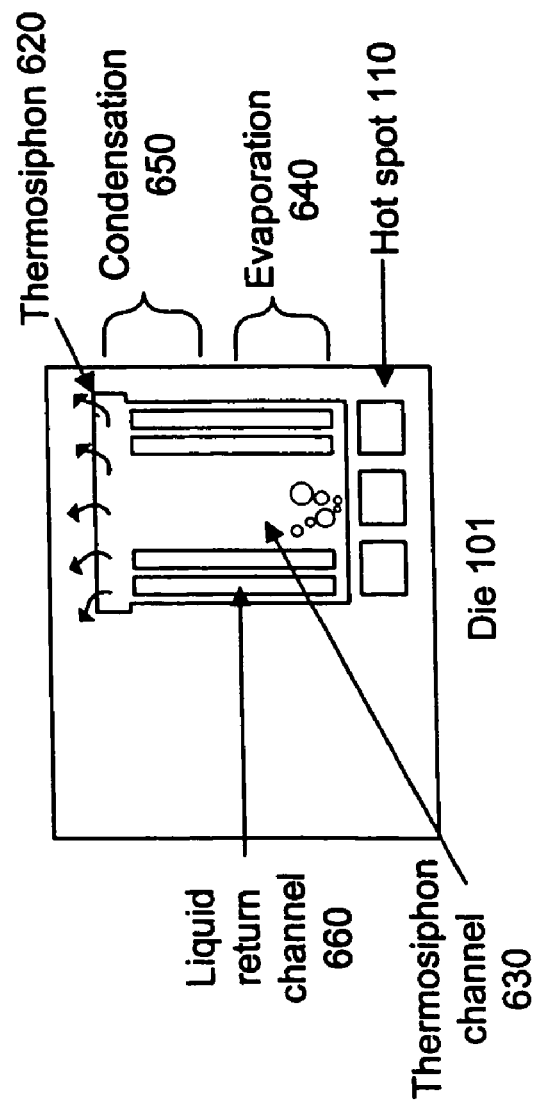

In other embodiments, one or more thermosiphons may include multiple channels, wherein at least one channel is surrounded by another channel. The channels may be partially connected. FIGS. 6A and 6B show top and side views, respectively, of such a thermosiphon embodiment 600. Thermosiphon 620 includes liquid return channels 660 within a thermosiphon channel 630. Each liquid return channel 660 may be connected to thermosiphon channel 630 at some location (not shown), such as ends of liquid return channels 660. Heat from a hot spot 110 is absorbed by thermosiphon 620. Water in thermosiphon 620 evaporates in evaporation portion 640 of thermosiphon 620. Heat is transferred to a cooler spot in die 101 and, in some embodiments, ultimately to a spreader. Water vapor condenses in condensation portion 650. Water flows back to evaporation portion 640 via liquid return channels 660.

The foregoing description of the preferred embodiments is provided to enable any person skilled in the art to make or use the present invention. Various modifications to these embodiments are possible, and the generic principles presented herein may be applied to other embodiments as well. For instance, a geometry for a micro-chimney or a thermosiphon need not conform to the geometries presented above. Various geometries, including irregularly shaped geometries, may be utilized. Further, multiple geometries may be employed in a single die. As such, the present invention is not intended to be limited to the embodiments shown above but rather is to be accorded the widest scope consistent with the principles and novel features disclosed in any fashion herein.

What is claimed is:

1. A method for dissipating heat from a localized area, the method comprising:
   providing a semiconductor die with at least one conduit directly within the semiconductor die, the conduit being proximate to the localized area within the semiconductor die, the conduit being at least partially filled with a heat-dissipating material;
   absorbing, by the conduit, heat from the localized area; and
   dissipating, by the conduit, at least a portion of the heat away from the localized area.

2. The method of claim 1, wherein heat-dissipating material comprises a fluid.

3. The method of claim 2, wherein the fluid is a dielectric.

4. The method of claim 2 wherein the fluid is capable of changing phase.

5. The method of claim 2, wherein the fluid is a liquid.

6. The method of claim 5, wherein the dissipating by the conduit includes evaporating by the liquid to form a vapor, releasing heat by the vapor, and condensing of the vapor.

7. The method of claim 6, wherein the condensation created by the condensing of the vapor travels down a side of the conduit.

* * * * *